(12) United States Patent
Levardo

(10) Patent No.: US 6,600,222 B1
(45) Date of Patent: Jul. 29, 2003

(54) STACKED MICROELECTRONIC PACKAGES

(75) Inventor: Melvin N. Levardo, Cavite (PH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/198,032

(22) Filed: Jul. 17, 2002

(51) Int. Cl.[7] .................. H01L 23/02; H01L 23/48; H01L 23/40; H01L 23/52
(52) U.S. Cl. .................. 257/686; 257/685; 257/777; 257/783
(58) Field of Search ............... 257/686, 685, 257/777, 723, 783, 786

(56) References Cited

U.S. PATENT DOCUMENTS

| | | | |
|---|---|---|---|
| 5,776,797 A | * | 7/1998 | Nicewarner, Jr. et al. ... 438/107 |
| 6,028,365 A | * | 2/2000 | Akram et al. ............ 257/778 |
| 6,208,521 B1 | * | 3/2001 | Nakatsuka ............. 361/749 |
| 6,225,688 B1 | | 5/2001 | Kim et al. |
| 6,486,544 B1 | * | 11/2002 | Hashimoto ............. 257/686 |
| 2001/0000053 A1 | * | 3/2001 | Suh et al. ............. 257/686 |
| 2001/0033009 A1 | * | 10/2001 | Inoue et al. ............ 257/668 |

* cited by examiner

Primary Examiner—Jasmine J B Clark
(74) Attorney, Agent, or Firm—Robert G. Winkle

(57) ABSTRACT

A microelectronic assembly including a flexible substrate with a first and a second surface, and with a microelectronic die portion and an external interconnect portion. The substrate has conductive traces integrated therewith. A first microelectronic die has an active surface electrically connected to the substrate first surface in the substrate microelectronic die portion. A second microelectronic die is electrically connected by its active surface to the substrate second surface in the substrate microelectronic die portion. External interconnect pads are disposed on the substrate second surface in the substrate external interconnect portion, wherein at least one conductive trace is in electrical contact with at least one external interconnect pad and with either the first microelectronic die, the second microelectronic die, or both. The substrate is folded and a portion of the first surface in the external interconnect portion is attached to a back surface of the first microelectronic die.

21 Claims, 5 Drawing Sheets

STACKED MICROELECTRONIC PACKAGES

BACKGROUND OF THE INVENTION

1. Field of the Invention

The present invention relates to stacked dice packages and methods for fabricating the same. In particular, the present invention relates to the use of a flexible substrate for the fabrication of stacked dice packages.

2. State of the Art

Higher performance, reduced cost, increased miniaturization of integrated circuit components, and greater packaging densities of microelectronic devices are ongoing goals of the computer industry. One method of increasing the density of microelectronic device packages is to stack the individual microelectronic dice within the packages.

Various approaches have been taken in the fabrication of stacked dice packages. One approach is to simply attach a first microelectronic die (such as a microprocessor, a chipset, a memory device, an ASIC, and the like) to a carrier substrate (such as an interposer, a motherboard, a back surface of another microelectronic die, or the like). The first microelectronic die may be attached to the carrier substrate by its active surface (i.e., by flip chip attachment) or by its back surface with electrical contact made by wire bonds, as will be understood to those skilled in the art. A second microelectronic die is then stacked by its back surface on the first microelectronic die and secured by a layer of adhesive (and may include appropriate spacing devices). The second microelectronic die makes electrical contact with the carrier substrate through a plurality of bond wires extending between bond pads on an active surface of the second microelectronic die and land pads on the substrate. Although this approach appears simple, the fabrication process is relatively complex and this approach requires lands pads on the carrier substrate, which takes up valuable "real estate" thereon.

Another approach includes the use of a flexible substrate to route electrical traces from the second microelectronic die to a position between the first microelectronic die and the substrate to make electrical contact with the carrier substrate. FIG. 10 shows such an arrangement, wherein a first microelectronic die 202 and a second microelectronic die 204 are attached to and in electrical contact with a first surface 208 of a flexible substrate 206 through attachment interconnects 212 and 214, respectively. An encapsulant material 216 is dispersed under and proximate each of the first microelectronic die 202 and the second microelectronic die 204.

The flexible substrate 206 includes conductive traces (not shown) disposed therein, thereon, and/or therethrough which make contact with an array 222 of external interconnects 224 (such as solder balls) disposed on a second surface 226 of the flexible substrate 206 proximate the first microelectronic die 202. Thus, both the first microelectronic die 202 and the second microelectronic die 204 have external interconnects 224 within the array 222. The flexible substrate 206 is bent such that a back surface 232 of the first microelectronic die 202 can be attached to a back surface 234 of the second microelectronic die 204 with a layer of adhesive 236. The external interconnects 224 are attached to a carrier substrate 238 using a C4 (controlled collapse chip connect) process.

Although such an approach results in an effective stacked package, it is not conducive to having microelectronic dice that are mismatched in size or height, or mismatched between microelectronic die that are encapsulated and those that are not, as the first microelectronic die back surface 232 and second microelectronic die back surface 234 must provide adequate surfaces for attachment to one another. These deficiencies greatly reduce the utility of such stacked packages.

Furthermore, passivation damage may occur with such stacked packages. Passivation damage is a defect of microelectronic die where the surface coating of the circuit was torn, scratched or pierced by any material exposing the microelectronic die traces or even damaging the integrated circuitry resulting in an electrical circuit "open", as will be understood by those skilled in the art. It is commonly induced in microelectronic die attach processing with relative sensitive adhesive material, high bonding force requirement, and exposure to environment with lots of particles floating around. Boneline thickness control is also a problem on thin microelectronic die processing using paste adhesive. Microelectronic die level warpage is the effect of thinning the microelectronic die (e.g., silicon) that makes mechanical stresses on the wafer becomes visible after being grinded. It also becomes significant enough to affects the straightness of the adhesive bondline thickness. Special flattening process is required to resolve the issue.

Therefore, it would be advantageous to develop a stacked package that is conducive to the use of a variety of microelectronic die sizes and types and that reduces the potential for passivation damage.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
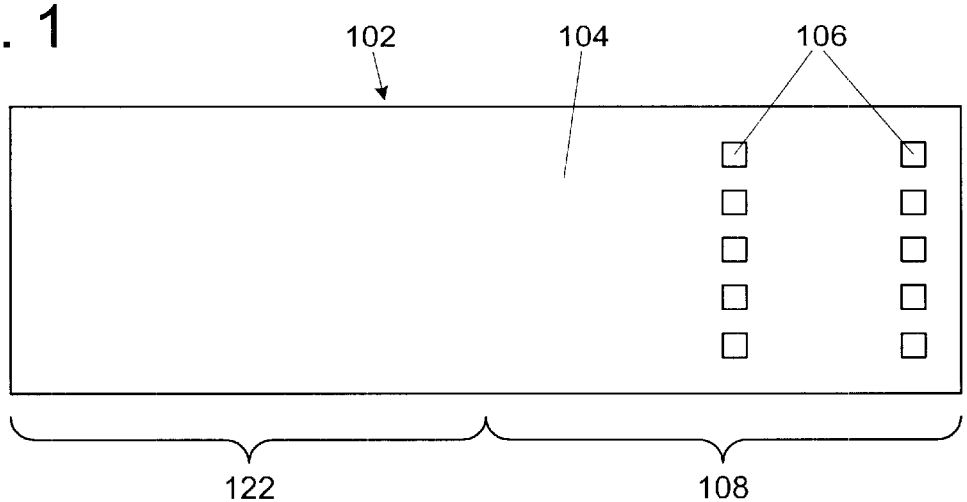
FIG. 1 is a plan view of a first surface of a flexible substrate, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 illustrates a first surface 104 of a flexible substrate 102 having at least one first surface attachment pad 106 thereon, wherein at least one flexible substrate first surface attachment pad 106 at disposed in a microelectronic die portion 108 of the flexible substrate 102. The flexible substrate 102 is preferable a polymeric material, such as polyimide tape or other such flex tape, as known in the art.

Figure 2:
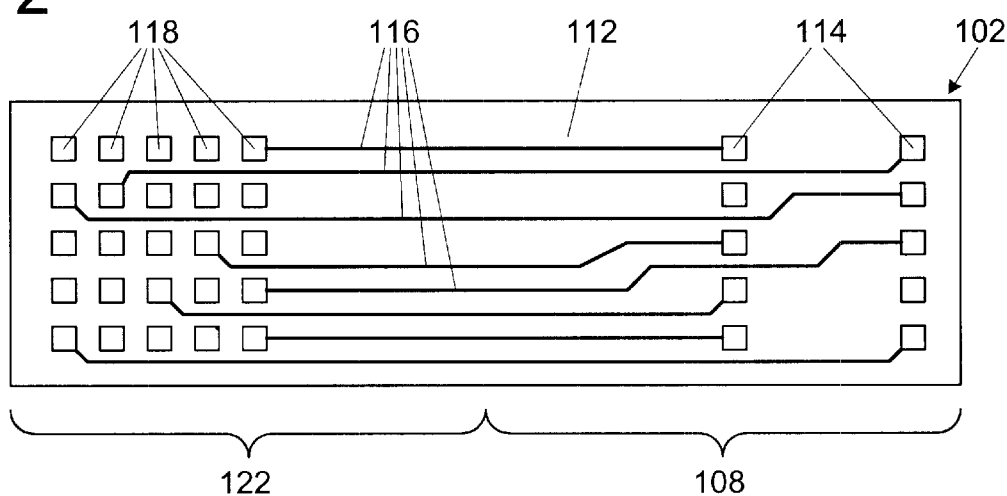
FIG. 2 is a plan view of a second surface of a flexible substrate, according to the present invention.

FIG. 2 illustrates a second surface 112 of the flexible substrate 102 (opposing said flexible substrate first surface 104) having at least one flexible substrate second surface attachment pad 114 located in the microelectronic die portion 108 of the flexible substrate 102. At least one conductive trace 116 extends from at least one flexible substrate second surface attachment pad 114 to at least one external interconnect pad 118, which is disposed in an external interconnect portion 122 of the flexible substrate 102. The conductive traces 116, the flexible substrate first surface attachment pads 106 (shown in FIG. 1), and the flexible substrate second surface attachment pads 114 are preferably metals, such as copper (preferred), aluminum, silver, gold, alloys thereof, and the like, but may also be formed from conductive polymers, such as copper-filled epoxies and the like.

Figure 3:
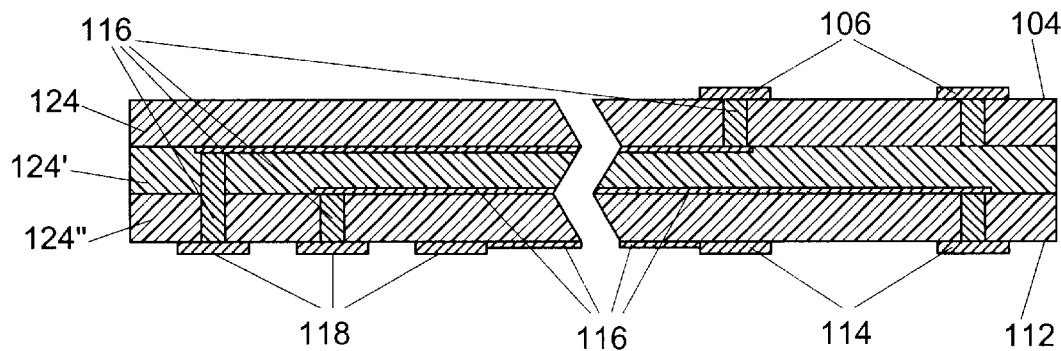
FIG. 3 is a side cross-sectional view of a flexible substrate, according to the present invention.

As shown in FIG. 3, the flexible substrate 102 may be a plurality of layers (illustrated as elements 124, 124' and 124"), wherein the conductive traces 116 may be integrated (i.e., disposed on, in, or through) with the flexible substrate layers 124, 124', and/or 124". The conductive traces 116 also extend through the flexible substrate 102 to achieve contact between at least one of the first surface attachment pads 106 and at least one external interconnect pad 118.

Figure 4:
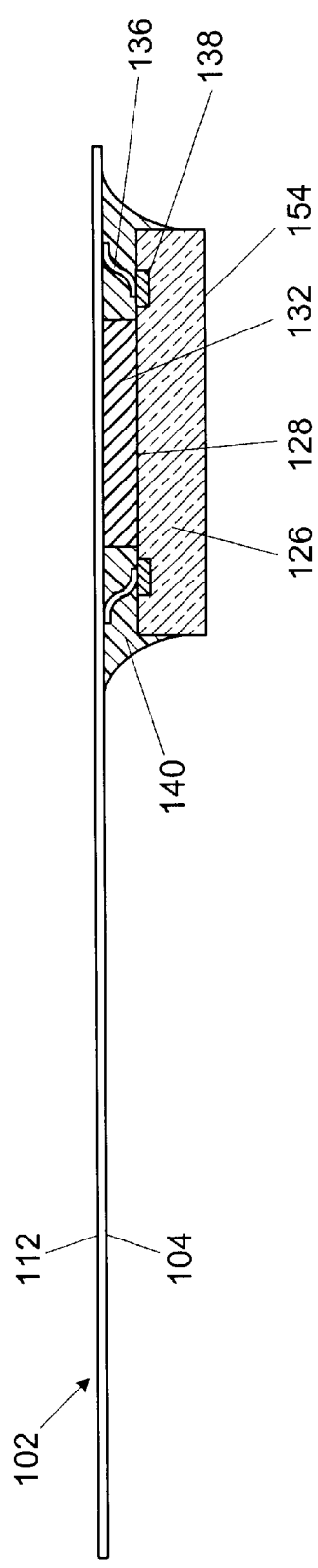
FIGS. 4–7 are side cross-sectional views of a method of fabricating a microelectronic package, according to the present invention.

FIG. 4 illustrates a first microelectronic die 126 (such as an active device including microprocessor, a chipset, a memory device, an ASIC, and the like, or passive devices, including resistors, capacitors, and the like) attached by an active surface 128 thereof to the flexible substrate first surface 104 by a first layer of adhesive 132, including, but not limited to, epoxies, urethane, polyurethane, and silicone elastomers. The first microelectronic die active surface 128 is also electrically connected to the flexible substrate 102 through at least one interconnect 136 extending between at least one bond pad 138 on the first microelectronic die active surface 128 and at least one flexible substrate first surface attachment pad 106 (shown in FIG. 1). It is, of course, understood that the first microelectronic die 126 may be electrically attached to the flexible substrate 102 by any known chip attachment technology, including but not limited to flip chip interconnects (solder or conductive polymer), surface mount technologies, TAB bonding, and the like, as will be understood to those skilled in the art. An encapsulant material 140 may be dispersed under and/or proximate the first microelectronic die 126. The encapsulant material 140 provides protection to the first microelectronic die 126 and mechanical stability to the final microelectronic package. The encapsulant material may include, but is not limited to plastics, resins, epoxies, and the like.

Figure 5:
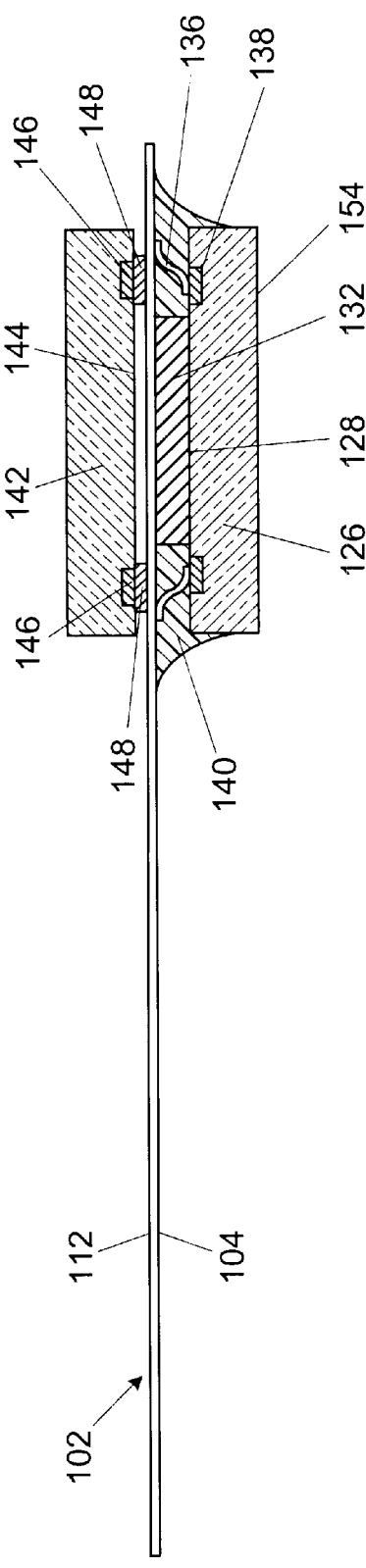

As shown in FIG. 5, a second microelectronic die 142 (such as an active device including microprocessor, a chipset, a memory device, an ASIC, and the like, or passive devices including resistors, capacitors, and the like) is electrically attached by an active surface 144 thereof to the flexible substrate second surface 112, such as by a solder connection 148 (i.e., a surface mount technology process) between bond pads 146 on the second microelectronic die active surface 144 and flexible substrate second surface attachment pads 114 (shown in FIG. 2). The second microelectronic die 142 does not need to have an encapsulant material dispersed under and/or proximate thereto, as sufficient mechanical stability is supplied by the first microelectronic die encapsulant material 140. Furthermore, the second microelectronic die 142 may be a discrete device that does not require encapsulation and can be attached to the flexible substrate second surface 112 with conductive paste or solder attach. Thus, the present invention can achieve a thinner package.

Figure 6:
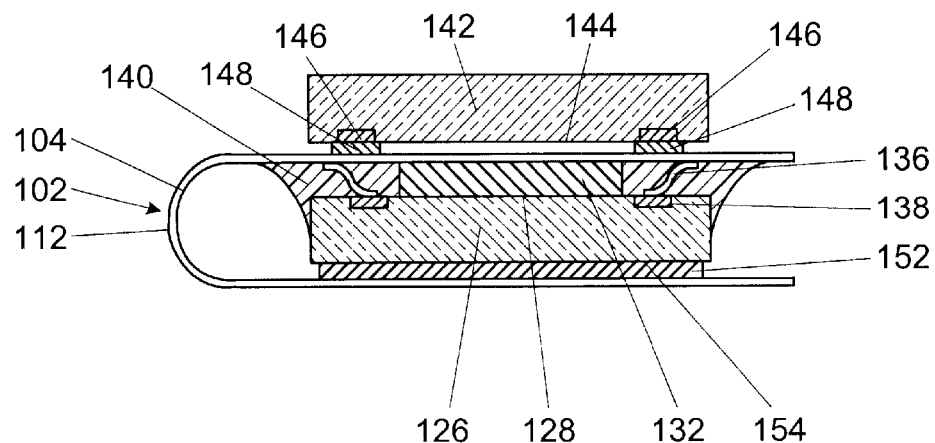

As shown in FIG. 6, the flexible substrate 102 is folded over and a portion of the external interconnect portion 122 (shown in FIGS. 1 and 2) of the flexible substrate first surface 104 is attached by an adhesive 152 to a back surface 154 of the first microelectronic die 126 (i.e., opposing the first microelectronic die active surface 128). A plurality of external interconnects 156, such as solder balls, may be disposed on the external interconnect pads 118, which is illustrated in FIG. 7, to form a microelectronic assembly 160.

Figure 8:
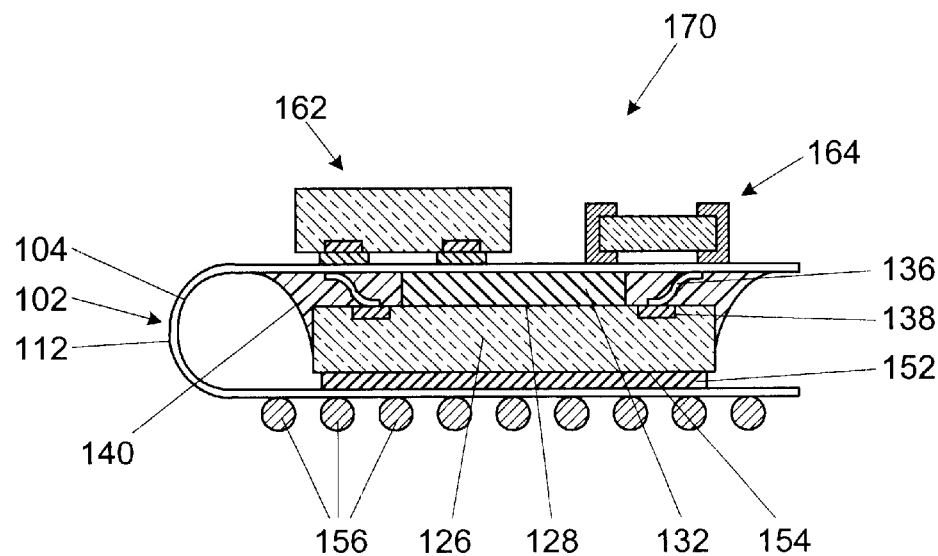
FIG. 8 is a side cross-sectional view of another embodiment of a microelectronic package, according to the present invention.

As shown in FIG. 8, a variety of microelectronic dice (illustrated as elements 162 and 164) of varying heights and sizes may be electrically attached to the flexible substrate second surface 112 to form a microelectronic assembly 170. In one embodiment, the first microelectronic die 126 is a flash memory device and element 162 is a microchip resistor, and element 164 is a capacitor or an inductor.

Figure 7:
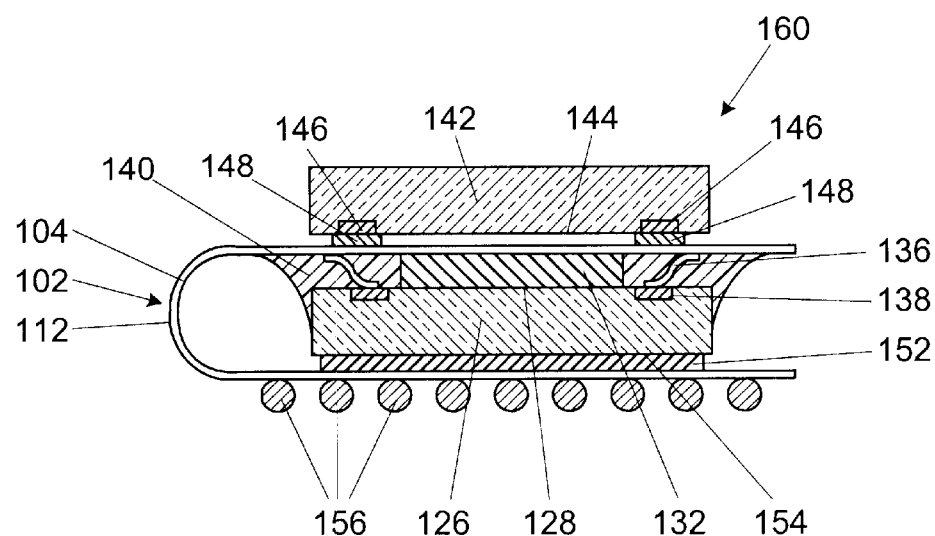
Figure 9:
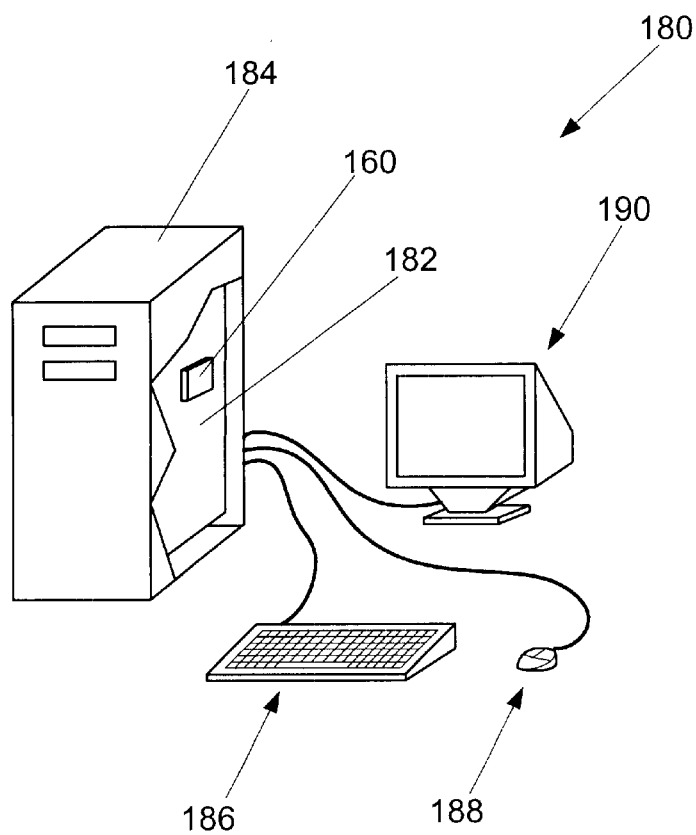
FIG. 9 is a schematic of a computer system, according to the present invention.
Figure 10:
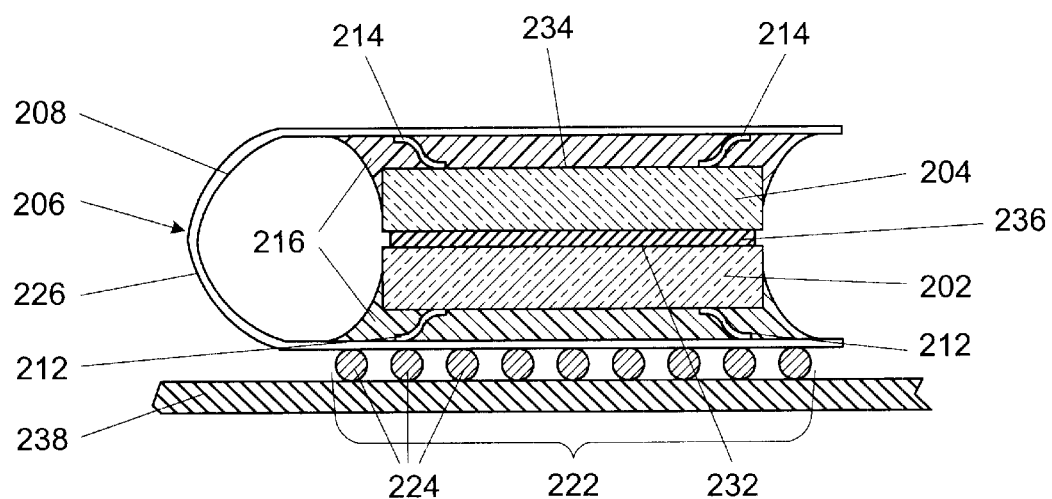
FIG. 10 is a side cross-sectional view of a stacked dice assembly, as known in the art.

The microelectronic packages formed by the present invention, such as microelectronic assembly 160 of FIG. 7, may be used in a computer system 180, as shown in FIG. 9. The computer system 180 may comprise a motherboard 182 with the microelectronic assembly 160 attached thereto, within a chassis 184. The motherboard 182 may be attached to various peripheral devices including a keyboard 186, a mouse 188, and a monitor 190.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic assembly, comprising:
   a flexible substrate having a first surface and an opposing second surface and having a microelectronic die portion and an external interconnect portion, said flexible substrate having at least one conductive trace integrated therewith;
   at least one first microelectronic die having an active surface and an opposing back surface, wherein said active surface is electrically connected to said flexible substrate first surface in said flexible substrate microelectronic die portion;
   at least one second microelectronic die electrically connected by an active surface to said flexible substrate second surface in said flexible substrate microelectronic die portion;

at least one external interconnect pad disposed on said flexible substrate second surface in said flexible substrate external interconnect portion, wherein said at least one conductive trace is in electrical contact with at least one external interconnect pad and at least one of said first microelectronic die and said second microelectronic die; and wherein at least a portion of said flexible substrate first surface in said external interconnect portion is attached to said first microelectronic die back surface.

2. The microelectronic assembly of claim 1, further including at least one external interconnect electrically attached to said at least one external interconnect pad.

3. The microelectronic assembly of claim 1, further including an encapsulant material dispersed proximate the first microelectronic die.

4. The microelectronic assembly of claim 1, wherein at least a portion of said at least one conductive trace is disposed on said flexible substrate.

5. The microelectronic assembly of claim 1, wherein said flexible substrate comprises a plurality of flexible substrate layers.

6. The microelectronic assembly of claim 5, wherein at least a portion of said at least one conductive trace is disposed between adjacent layers of said plurality of flexible substrate layer.

7. The microelectronic assembly of claim 1, wherein said at least one conductive trace is formed from a material selected from the group consisting of copper, aluminum, silver, gold, and alloys thereof.

8. A method of fabricating a microelectronic package, comprising:

providing a flexible substrate having a first surface and an opposing second surface and having a microelectronic die portion and an external interconnect portion, said flexible substrate having at least one conductive trace integrated therewith, said flexible substrate further including a plurality of external interconnect pads disposed on said flexible substrate second surface in said flexible substrate external interconnect portion;

electrically connecting an active surface of at least one first microelectronic die to said flexible substrate first surface in said flexible substrate microelectronic die portion;

electrically connecting an active surface of at least one second microelectronic die to said flexible substrate second surface in said flexible substrate microelectronic die portion;

providing an electrical contact between at least one of said plurality of external interconnect pads and at least one of said first microelectronic die and said second microelectronic die through a least one of said conductive traces; and attaching at least a portion of said flexible substrate first surface in said external interconnect portion to said first microelectronic die back surface.

9. The method of claim 8, further including attaching at least one external interconnect electrically to said at least one external interconnect pad.

10. The method of claim 8, further including dispersing an encapsulant material proximate said first microelectronic die.

11. The method of claim 8, wherein providing said flexible substrate having at least one conductive trace integrated therewith comprises providing said flexible substrate having at least a portion of at least one conductive trace disposed on said flexible substrate.

12. The method of claim 8, wherein providing said flexible substrate comprises providing a plurality of flexible substrate layers.

13. The method of claim 12, wherein providing said flexible substrate having at least one conductive trace integrated therewith comprises providing said flexible substrate having at least a portion of said at least one conductive trace disposed between adjacent layers of said plurality of flexible substrate layer.

14. The method of claim 8, wherein providing said flexible substrate having at least one conductive trace integrated therewith comprises providing said flexible substrate having at least one conductive trace formed from a material selected from the group consisting of copper, aluminum, silver, gold, and alloys thereof.

15. A computer system, comprising:

a motherboard;

a microelectronic package electrically attached to said motherboard, comprising:

a flexible substrate having a first surface and an opposing second surface and having a microelectronic die portion and an external interconnect portion, said flexible substrate having at least one conductive trace integrated therewith;

at least one first microelectronic die having an active surface and an opposing back surface, wherein said active surface is electrically connected to said flexible substrate first surface in said flexible substrate microelectronic die portion;

at least one second microelectronic die electrically connected by an active surface to said flexible substrate second surface in said flexible substrate microelectronic die portion;

a plurality of external interconnect pads disposed on said flexible substrate second surface in said flexible substrate external interconnect portion, wherein said at least one of said conductive trace is in electrical contact with at least one of said plurality of external interconnect pads and at least one of said first microelectronic die and said second microelectronic die; and wherein at least a portion of said flexible substrate first surface in said external interconnect portion is attached to said first microelectronic die back surface.

16. The computer system of claim 15, further including at least one external interconnect electrically attached to said at least one external interconnect pad.

17. The computer system of claim 15, further including an encapsulant material dispersed proximate the first microelectronic die.

18. The computer system of claim 15, wherein at least a portion of said at least one conductive trace is disposed on said flexible substrate.

19. The computer system of claim 15, wherein said flexible substrate comprises a plurality of flexible substrate layer.

20. The computer system of claim 19, wherein at least a portion of said at least one conductive trace is disposed between adjacent layers of said plurality of flexible substrate layer.

21. The computer system of claim 15, wherein said at least one conductive trace is formed from a material selected from the group consisting of copper, aluminum, silver, gold, and alloys thereof.

* * * * *